United States Patent [19]

Tsuji et al.

[11] 4,325,632
[45] Apr. 20, 1982

[54] METHOD OF PHOTOGRAPHIC PRINTING AND A PHOTOGRAPHIC ORIGINAL PLATE FOR USE THEREIN

[75] Inventors: Kikuro Tsuji, Joyo; Masaya Ishigaki, Kyoto, both of Japan

[73] Assignees: Dainippon Screen Seizo Kabushiki Kaisha; Kabushiki Kaisha Dai-ichi Shiko, both of Kyoto, Japan

[21] Appl. No.: 213,719

[22] Filed: Dec. 8, 1980

[30] Foreign Application Priority Data

Dec. 18, 1979 [JP] Japan ................................ 54-163516

[51] Int. Cl.³ .......................................... G03B 27/04
[52] U.S. Cl. ...................................... 355/86; 355/54; 355/71; 355/95; 355/132
[58] Field of Search ........................ 355/53, 54, 71, 77, 355/78, 79, 85, 86, 89, 95, 122, 124, 125, 132

[56] References Cited

U.S. PATENT DOCUMENTS 3,588,248   5/1968   Freund et al. .................... 355/54 X
4,225,223   9/1980   Papadakis ........................ 355/54

*Primary Examiner*—Richard A. Wintercorn
*Attorney, Agent, or Firm*—Jordan and Hamburg

[57] ABSTRACT

By providing a photographic original plate on which an original picture image and a light-shielding mask are formed, two identical pictures can be formed by exposing a sheet of photosensitive material with the original plate placed thereon and repeating the procedure after rotating the original plate 180 degrees about a point which is located outside of the picture image and the light-shielding mask. Though the two printed images are inverted relative to each other, the final prints are eventually cut apart along a central line and no problem arises. Through adoption of the method and the use of the novel photographic original plate, not only the printing process becomes simpler than conventional method but a better result in the final prints can be obtained.

6 Claims, 6 Drawing Figures

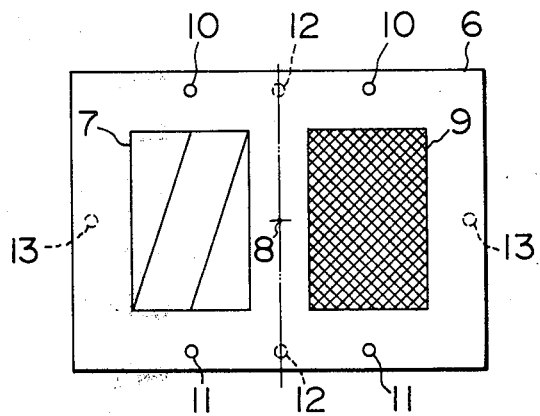
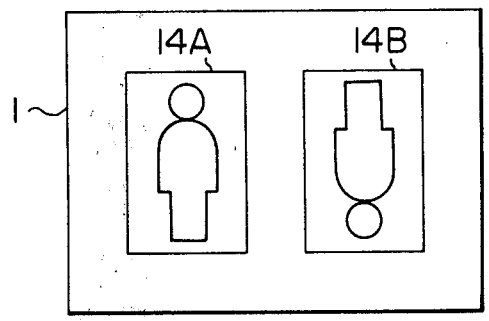
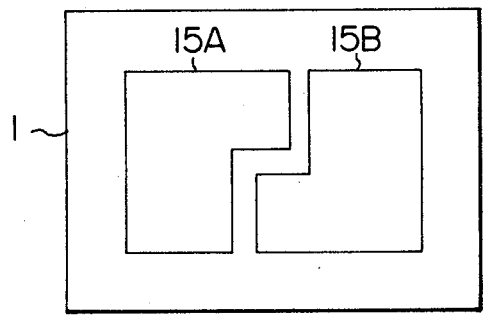

METHOD OF PHOTOGRAPHIC PRINTING AND A PHOTOGRAPHIC ORIGINAL PLATE FOR USE THEREIN

This invention relates to a method for photographically printing an identical picture on each of two areas defined on a photosensitive material and a printing plate for use in carrying out the method.

When printing a plurality of identical pictures on a single sheet of photosensitive material, it is generally practiced to expose the photosensitive material to light after overlaying a transparent sheet carrying an original picture image on a specified area with a right register, one at a time, and to repeat the procedure as frequently as the number of the desired prints. In such cases, it is necessary to cover the marginal areas with light shields so as to prevent those areas from being exposed to extraneous light. Otherwise, the marginal areas may be exposed to uncontrolled light and an undesireable result may develop.

In particular, when a positive exposure type or reversal type photographic film is used for making prints, such marginal area may not be completely exposed to light, for example, due to the stains on the transparent sheet which carries the original picture image, and undesireable spots and lines may thereby remain in these marginal areas, after developing the photographic film, where it is desired to be as transparent as possible. Therefore, to eliminate such black spots and lines, it is necessary to carry out another exposure, an auxiliary exposure, to make those areas completely transparent.

According to a known technique, two identical prints are made on one sheet of photosensitive material in the following manner.

First of all, a transparent sheet carrying an original picture image is placed over a half of the whole area of the photosensitive material while the remaining half area of the photosensitive material is covered with a light shielding material. After that, the first exposure is performed over the photosensitive material.

After the first exposure, the positions of the transparent sheet and the light shielding mask are reversed with their positions properly registered with respect to the previous positions of the other ones, respectively. Then the second exposure is performed over the photosensitive material.

In the above described process, if the registration is not proper, either the fringes of the pictures disappear or black lines are formed on the fringes. And, unattractive black lines are sometimes formed on the central line.

This known technique is commonly used for printing two picture on a sheet of single photosensitive material but requires considerable care and time particularly for attaining a proper registration.

Furthermore, when the photosensitive material happens to be positive exposure type or reversal type photographic film, it becomes sometimes necessary to perform auxiliary exposures before or after the actual exposures for making prints.

Accordingly, one of the primary objects of this invention is to provide a method for making two identical prints on a sheet of photosensitive material which is more efficient and capable of producing better results. And another object of this invention is to provide a photographic printing plate which is suitable for use in carrying out the above mentioned new method.

According to this invention, such objects are accomplished by providing a method for photographically printing an identical picture on each of two areas defined on a photosensitive material such that these two areas are 180 degrees rotated from each other about a point of symmetry, comprising a first printing step in which the photosensitive material is exposed to light with a transparent sheet, carrying thereon an original picture image and a light shielding area, closely overlayed thereon in such a manner that the original picture image and the light shielding area are generally registered over the two areas defined on the photosensitive material 180 degrees apart from each other about the point of symmetry, and a second printing step in which the photosensitive material is exposed to light with the transparent sheet closely overlayed thereon after changing the positions of the original picture image and the light shielding area one another in such a manner that each of the original picture image and the light shielding area is registered over the other one of the two areas on the photosensitive material, and a photographic printing plate for use in the method described above, characterized by comprising an original picture formed thereon and a light shielding area which is identical in shape with the outer frame of the original picture image and geometrically rotated 180 degrees from the original picture image about a point located outside of the original picture image and the light shielding area, and by being transparent otherwise.

Novel features and the advantages of this invention will become apparent to one skilled in the art from a reading of the following decription in conjunction with the accompanying drawings wherein specific ebodiments and prior arts are illustrated and in which:

FIG. 4 shows an embodiment of the photographic printing plate according to this invention;

FIGS. 5 and 6 are examples of the shapes of the areas defined on the photosensitive material, with their images inverted and disposed side by side.

Now, before describing the preferred embodiments of this invention, the prior art is explained hereinafter for facilitating the understanding of the present invention which is essentially an improvement of the prior art, making reference to FIGS. 1, 2 and 3.

Figure 1:
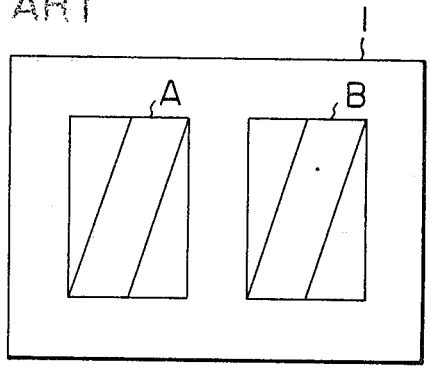
FIG. 1 shows a state where two identical pictures are printed on a sheet of photosensitive material.

Here, what is desired to be accomplished is to print two identical pisctures (A) and (B) on a photosensitive material side by side as shown in FIG. 1. To that end, a transparent sheet 2 having an original having an original picture image (C) formed thereon is placed over the left-hand side of the photosensitive material 1 with a proper register while the right-hand side of the photosensitive material is covered with a light shielding mask 3 for protecting the concerned area from the light for exposure. Thus, after exposure, the left-hand side of the photosensitive material comes to have a picture printed thereon while the right-hand side of the photosensitive material remains unexposed to light.

Thereafter, the transparent sheet 2 formed as a photographic film is moved to the right-hand side of the photosensitive material 1 while the left-hand side is this time covered with the light-shielding mask 3 for conducting a second exposure. Thus, after two exposures, the photosensitive material 1 is printed with two identical pictures (A) and (B).

This is a very common method for making two identical prints on a single sheet of photosensitive material. But, according to this method, the transparent sheet and the light-shielding mask have to be registered properly over the photosensitive material twice, respectively, and it is known to be very time-consuming and difficult work for an operator.

If there occurs even one mis-register in the process, the concerned area of the photosensitive material will develop black areas or lines or, sometimes, a portion of a photographic image will be erased out.

Particularly in the case when the photosensitive material is a positive exposure type of reversaly type photographic film, a smear or a scratch on the transparent sheet may leave dark spots on the marginal areas outside of the areas of the pictures (A) and (B). Furthermore, it is very difficult to prevent a black line developing on the vertical center line of the photosensitive material arising from the mis-register of the light-shielding mask 3 in the two exposures.

Therefore, it is often necessary to perform auxiliary exposures for obtaining a satisfactory result. The auxiliary exposures are performed by placing light-shielding masks (5A) and (5B) formed on a transparent sheet 4 exactly over the areas of the pictures (A) and (B) which are formed on the reversal type photosensitive material and performing an exposure using light with a sufficient intensity to make the marginal areas completely transparent. An example of such a transparent sheet 4 carrying two light-shielding masks (5A) and (5B) are shown in FIG. 3.

Now, according to this invention, such disadvantages of the prior art can be circumvented by providing a photographic original plate which is made of a transparent base sheet 6 carrying a desired piture image 7 and a light-shielding area 9 in such a manner the outer frame of the original picture image 7 coincide with the light-shielding area 9 after rotating the photographic original plate 180 degrees.

When a photosensitive material of a reversal type is exposed to light with this original plate placed thereover, the area covered by the light-shielding area 9 is not exposed to light at all and the area covered by the area of the original picture image 7 is printed with that image, while the marginal areas receives an auxiliary exposure in the process.

Then, after rotating the original plate 6 180 degrees and each of the areas is properly registered over the corresponding areas of the photosensitive material 6 by means of the register pin holes 10 and 11 provided on the fringes of the original plate 6 as well as of the photosensitive material 1. Under this condition, a second exposure is performed and the two identical pictures (A) and (B) are thereby formed on the photosensitive material 1 after a proper development process. In the meantime, the marginal areas again automatically receive an auxiliary exposure. Since the two auxiliary exposures are performed with the orientation of the transparent sheet reversed each time, the marginal areas can be made completely transparent unless a smear or a scratch on the transparent sheet exactly coincide with itself by chance after the 180 degree rotation or the intensity of the light for the auxiliary exposure is not sufficient.

Thus, according to this invention, the whole printing process is considerably simplified relative to the prior art and less care is necessary on the part of the operator since a proper register is assured by the register pin holes 10 and 11 which fit onto corresponding register pins which are not shown in the drawings.

Although the present invention was described with specific embodiments thereof but is is obvious to a person skilled in the art that there are many possible modifications and replacements without departing from the spirit of this invention. For example, the register pin holes 10 and 11 may be provided not on the upper and lower margins of the transparent sheet 6 but near the upper and lower ends of the central line as shown by imaginary lines and numeral 12 in FIG. 4 so as to be symmetric about the central point 8, about which the pictures (A) and (B) are also symmetric in the sense that the two pictures coincide each other when the finished prints are integrally rotated 180 degrees about the central point 8. Alternatively, register pin holes may be provided on both sides of the marginal areas of the transparent sheet and the photosensitive material as long as they are symmetric with respect to the point 8 as indicated by numeral 13 in FIG. 4. As a matter of fact, as long as at least two register pin holes are formed in the transparent sheet and the photosensitive material so as to be symmetric each other about the point 8 in the aforementioned sense, the number and locations of the register pin holes are of little significance to this invention.

Figure 2:
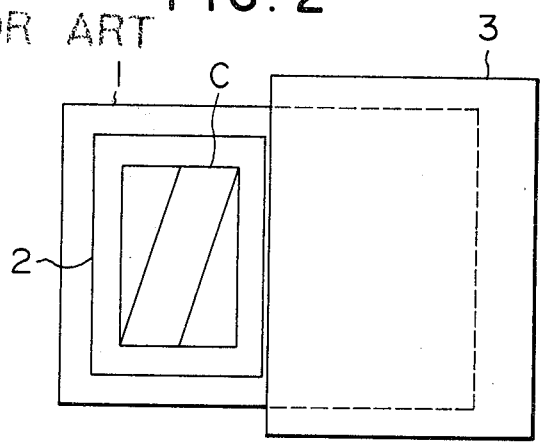
FIG. 2 illustrates the manner of a conventional printing.
Figure 3:
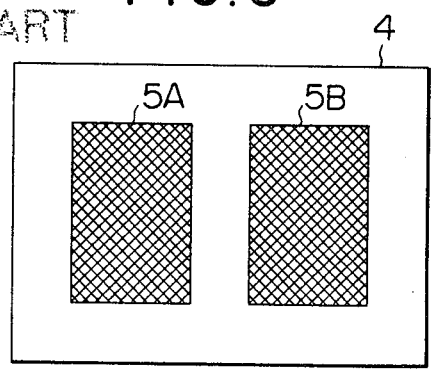
FIG. 3 shows the masks for carrying out the auxiliary exposure.

By the way, although the images shown in FIGS. 1, 2 and 4 are symmetric in the sense that they do not change shape when rotated 180 degrees, generally the two pictures printed on the photosensitive material are inverted relative to one another as the pictures 14a and 14b are in FIG. 5. However, normally, final prints formed as shown in FIG. 5 are cut apart along a vertically extending central line before bound into brochures or the like and the fact that the images are inverted relative to each other is of little significant to this invention.

Also, the shape of the outer frame of the picture images was rectangular in the above described embodiments but the shape may be arbitrarily selected as long as they are symmetric about the point 8 in the sense that they coincide each other after rotating 180 degrees about the point 8. For example, an irregular shape indicated by numerals 15a and 15b in FIG. 6 is equally applicable to this invention.

As described above, the photographic printing method and the original plate for use therein both according to this invention elemiate the need for a light-shielding mask, a mask for auxiliary exposures when reversal type photosensitive material is used and the auxiliary exposures themselves, as well as the care which is otherwise required for attaining proper registration in the process, thereby improving the efficiency when printing identical two pictures on a single sheet of photosensitive material and serving as a useful alternative in actual applications.

We claim:

1. A method for photographically printing an identical picture on each of two areas defined on a photosensitive material such that these two areas are located 180 degrees apart from each other about a point of symmetry, comprising:

a first printing step in which the photosensitive material is exposed to light with a transparent sheet, carrying thereon an original picture image and a light shielding area, closely overlayed thereon in such a manner that the original picture image and the light shielding area are generally registered over the two areas defined on the photosensitive material 180 degrees apart from each other about a point of symmetry, respectively, and a second printing step in which the photosensitive material is exposed to light with the transparent sheet closely overlayed thereon after changing the positions of the original picture image and the light shielding area one another in such a manner that each of the original picture image and the light shielding area is registered over the other one of the two areas on the photosensitive material.

2. A method according to claim 1, wherein the photographic material ia a positive exposure type or reversal photographic film.

3. A method according to claim 2, wherein the transparent sheet is registered upon the photographic film using at least two register pins.

4. A method according to claim 3, wherein the two areas defined on the photographic film are rectangular in shape.

5. A method according to claim 3, wherein the two areas defined on the photographic film are irregular in shape and are mutually symmetric about a point located outside of these two areas.

6. A photographic printing plate for use in the method described in any of claims 1 through 5, characterized by comprising an original picture formed thereon and a light shielding area which is identical in shape with the outer frame of the original picture image and geometrically rotated 180 degrees from the original picture image about a point located outside of the original picture image and the light shielding area, and by being transparent otherwise.

* * * * *